(12) United States Patent
Lee

(10) Patent No.: US 12,120,257 B2
(45) Date of Patent: Oct. 15, 2024

(54) FOLDING PLATE AND MANUFACTURING METHOD THEREFOR

(71) Applicant: AMOSENSE CO., LTD., Cheonan-si (KR)

(72) Inventor: Jihyung Lee, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 0 days.

(21) Appl. No.: 17/917,469

(22) PCT Filed: Apr. 5, 2021

(86) PCT No.: PCT/KR2021/004228
§ 371 (c)(1),
(2) Date: Oct. 6, 2022

(87) PCT Pub. No.: WO2021/206394
PCT Pub. Date: Oct. 14, 2021

(65) Prior Publication Data
US 2023/0328162 A1 Oct. 12, 2023

(30) Foreign Application Priority Data

Apr. 7, 2020 (KR) ........................ 10-2020-0042304
May 19, 2020 (KR) ........................ 10-2020-0059682

(51) Int. Cl.
*B23K 1/00* (2006.01)
*B32B 1/00* (2024.01)
(Continued)

(52) U.S. Cl.
CPC ......... *H04M 1/0268* (2013.01); *B23K 1/0008* (2013.01); *B32B 15/015* (2013.01);
(Continued)

(58) Field of Classification Search
CPC ...... B23K 1/0008; B23K 1/19; B23K 20/023; B23K 1/20
See application file for complete search history.

(56) References Cited

U.S. PATENT DOCUMENTS 3,761,328 A * 9/1973 Abe et al. ............... H01L 21/00
148/DIG. 147
4,005,468 A * 1/1977 Tanimura ................ H01L 31/00
148/DIG. 20
(Continued)

FOREIGN PATENT DOCUMENTS

| CN | 104423698 A | 3/2015 |
| JP | 07-232284 A | 9/1995 |

(Continued)

OTHER PUBLICATIONS

AME; https://metaletching.com/what-is-the-photo-etching-process; Apr. 2019 (Year: 2019).*
(Continued)

*Primary Examiner* — Erin B Saad
(74) *Attorney, Agent, or Firm* — Maschoff Brennan

(57) ABSTRACT

A folding plate according to an embodiment of the present invention has first and second support portions located on both sides of a folding portion that is foldable, and is formed as a multilayer structure in which first and second metal sheets of different metal materials are braze-bonded, and thus, is thin and lightweight, has excellent flexibility, and easily dissipates heat.

4 Claims, 5 Drawing Sheets

(51) Int. Cl.
*B32B 15/01* (2006.01)
*B32B 15/02* (2006.01)
*H04M 1/02* (2006.01)
*H05K 7/20* (2006.01)

(52) U.S. Cl.
CPC ......... *B32B 15/02* (2013.01); *H05K 7/20963* (2013.01); *B32B 2457/206* (2013.01); *H04M 1/0214* (2013.01)

(56) References Cited

U.S. PATENT DOCUMENTS

| | | | | |
|---|---|---|---|---|
| 4,026,677 | A * | 5/1977 | Galasso | B23K 35/325 228/195 |
| 6,020,076 | A * | 2/2000 | Fujii | C04B 37/026 428/665 |
| 6,106,960 | A * | 8/2000 | Fujii | B23K 35/30 428/627 |
| 9,348,362 | B2 | 5/2016 | Ko et al. | |
| 9,568,948 | B2 | 2/2017 | Go et al. | |
| 10,516,119 | B2 | 12/2019 | Lee | |
| 11,780,021 | B2 * | 10/2023 | Strutt | B21D 35/007 228/164 |
| 2003/0034379 | A1 * | 2/2003 | Jackson | F01D 5/005 228/119 |
| 2008/0230590 | A1 * | 9/2008 | Takahashi | B23K 1/19 228/193 |
| 2009/0110879 | A1 * | 4/2009 | Lewis | B32B 3/04 428/137 |
| 2010/0124669 | A1 * | 5/2010 | Lee | C22C 19/05 228/226 |
| 2010/0247849 | A1 * | 9/2010 | Depaoli | B32B 7/12 428/116 |
| 2015/0101738 | A1 * | 4/2015 | Young | E04C 2/365 156/443 |
| 2017/0072516 | A1 * | 3/2017 | Elliot | B23K 35/286 |
| 2017/0297729 | A1 * | 10/2017 | Soria | B64D 29/00 |
| 2017/0348783 | A1 * | 12/2017 | Ponath | B23K 1/0016 |

FOREIGN PATENT DOCUMENTS

| | | |
|---|---|---|
| JP | 2001-278402 A | 10/2001 |
| JP | 2014-161009 A | 9/2014 |
| KR | 10-2004-0096474 A | 11/2004 |
| KR | 10-2017-0080799 A | 7/2017 |
| KR | 10-1909741 B1 | 10/2018 |
| KR | 10-2019-0060904 A | 6/2019 |
| KR | 10-2019-0073012 A | 6/2019 |

OTHER PUBLICATIONS

KR Office Action dated Oct. 8, 2019 as received in Application No. 10-2019-0094724.
KR Decision to Grant Dated Feb. 26, 2020 as received in Application No. 10-2019-0094724.
CN Office Action dated Apr. 13, 2024 as received in Application No. 202180027381.0.

* cited by examiner

[FIG. 1]
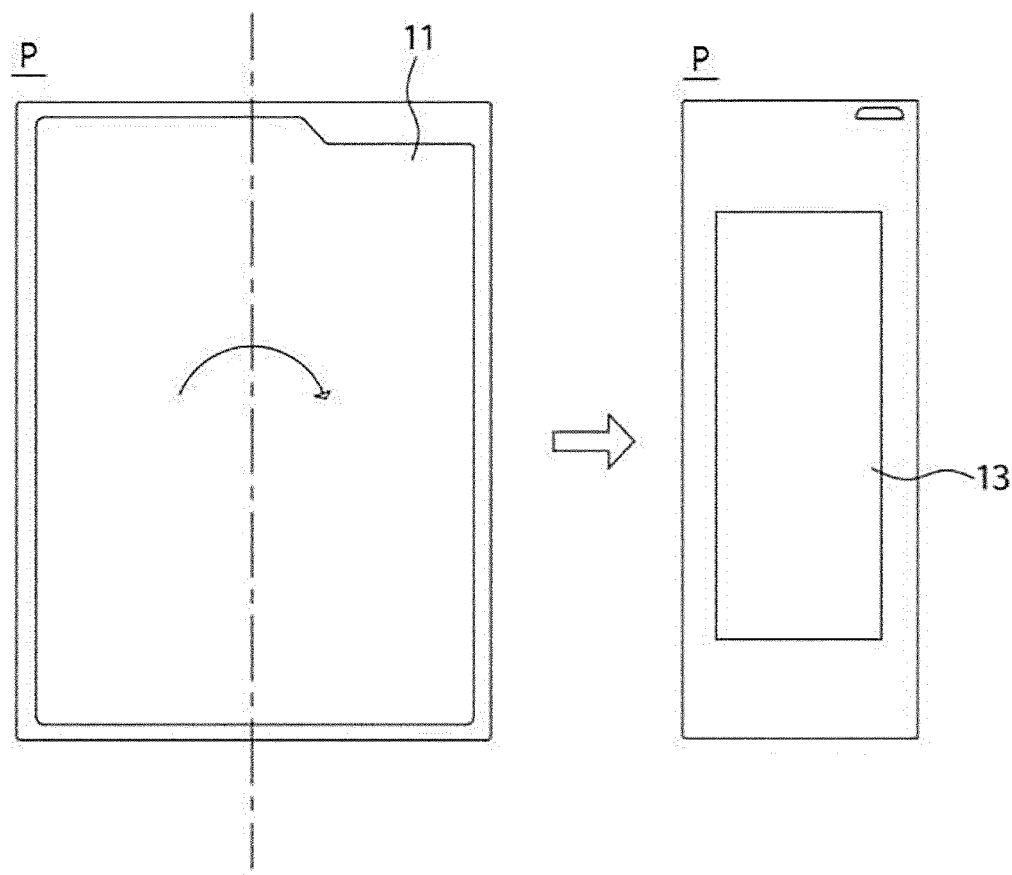

[FIG. 2]
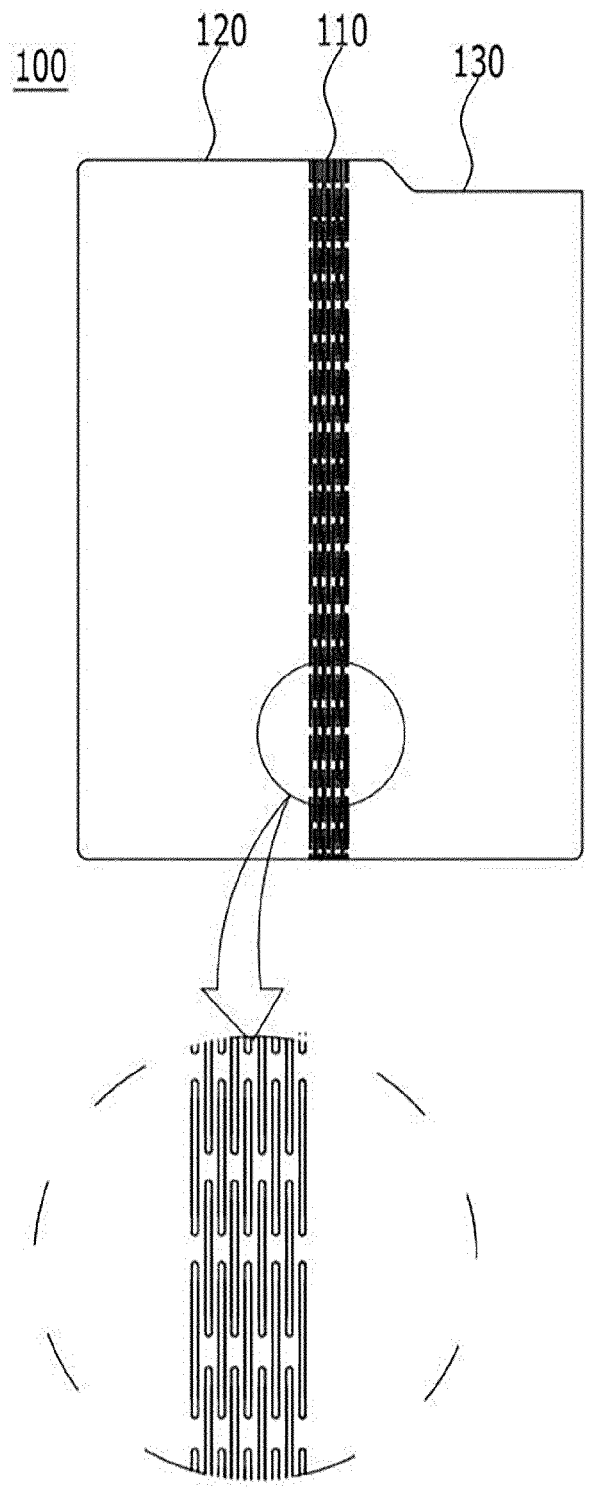

[FIG. 3]
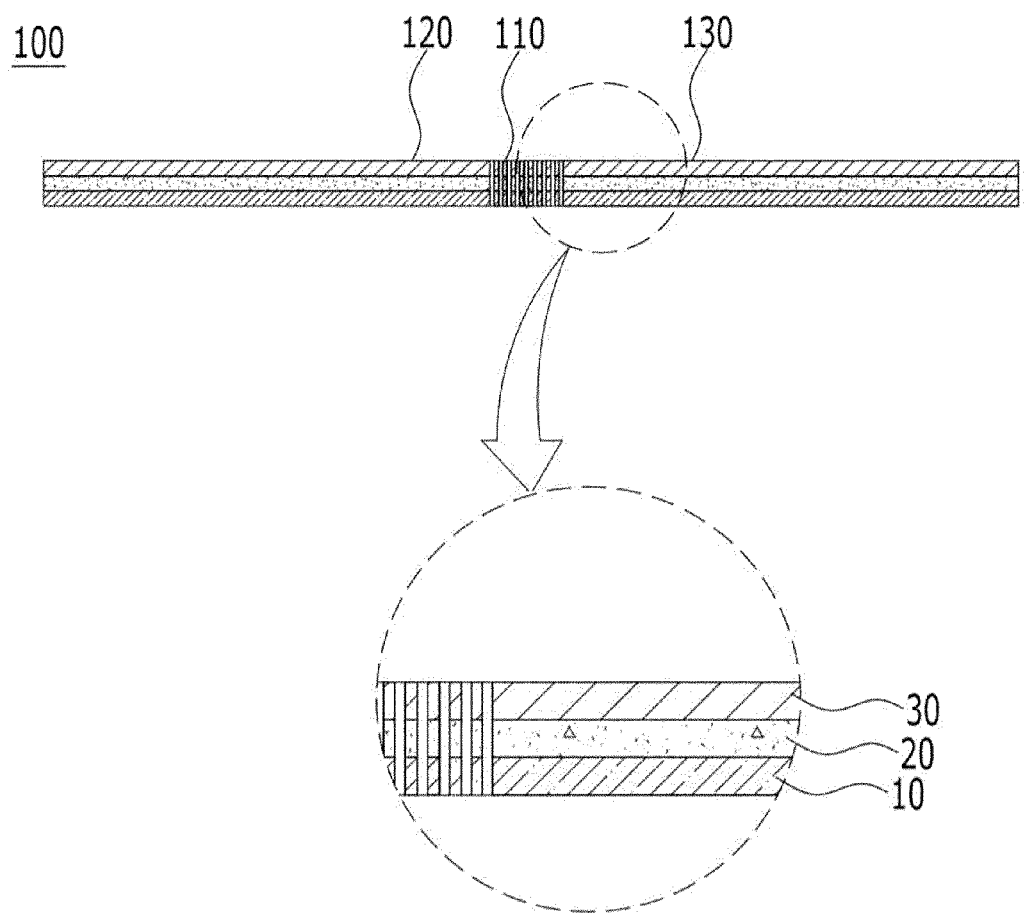

[FIG. 4]
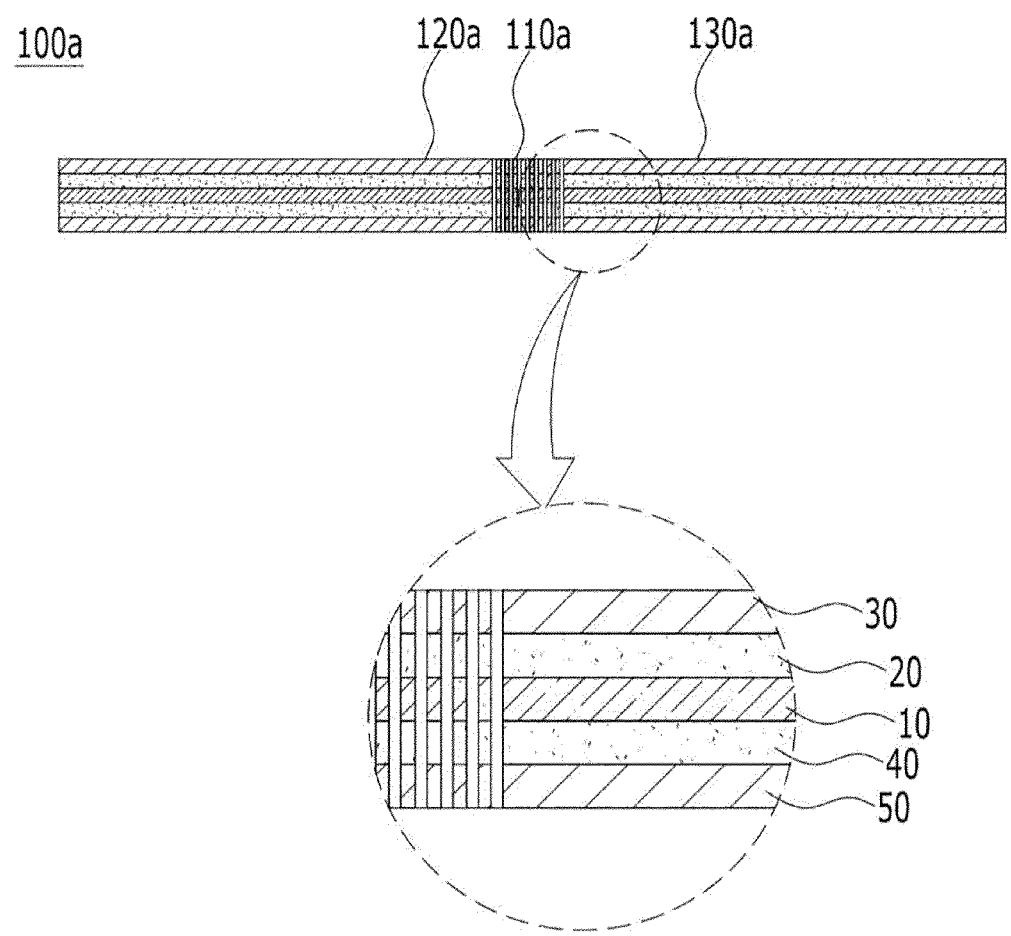

[FIG. 5]
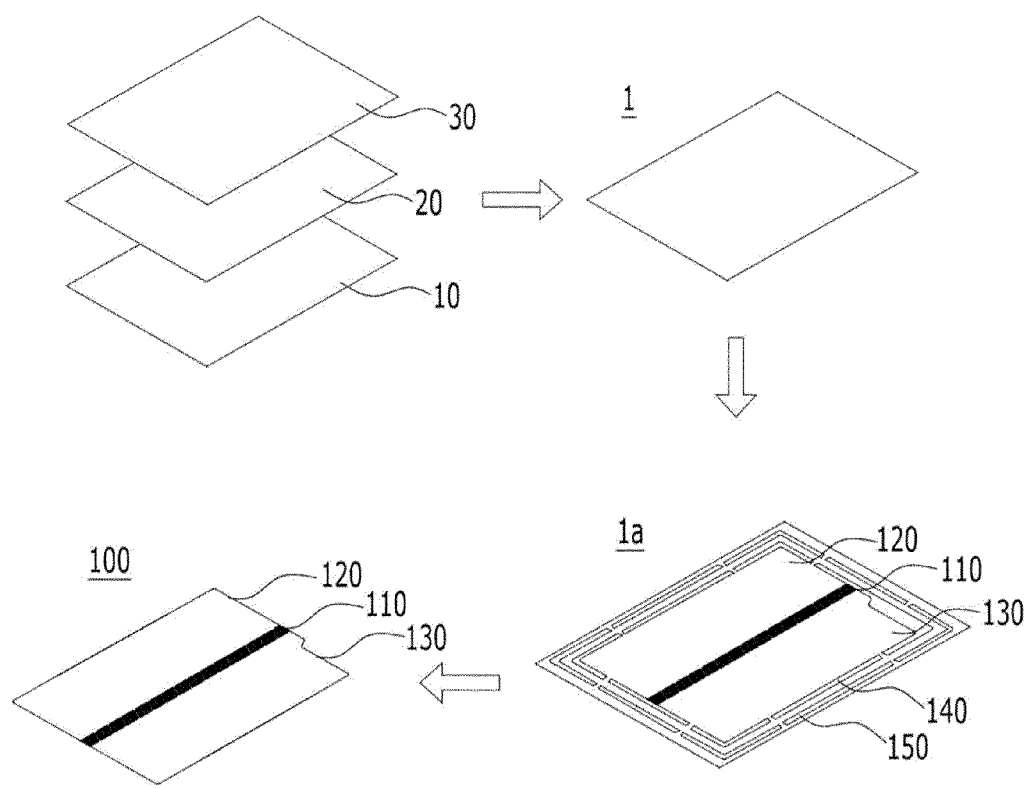

FOLDING PLATE AND MANUFACTURING METHOD THEREFOR

TECHNICAL FIELD

The present disclosure relates to a folding plate and a manufacturing method thereof, and more particularly, to a folding plate, which is applied to a foldable phone to support a display and has a folding function and a heat dissipation function, and a manufacturing method thereof.

BACKGROUND ART

Foldable phones are formed to allow screens to be folded using flexible organic light emitting diode (OLED) displays. The foldable phone can improve portability through a folding process and has an advantage of being able to use a wide screen when unfolded.

The foldable phone can fold or unfold the screen using a hinge, and since a folding plate is disposed on a rear surface of the display, when a folding portion is folded, the folding portion is completely folded, and when the folding portion is unfolded, a flat wide screen can be displayed without traces of a folded boundary.

The folding plate should have durability to be folded and unfolded tens of thousands of times, and it is important for the folding plate to have mechanical durability to support and protect a display portion from mechanical stress that may occur during folding.

In addition, the folding plate is required to be manufactured with a thin thickness and to have heat dissipation performance capable of dissipating heat generated from the display.

SUMMARY OF INVENTION

Technical Problem

The present disclosure has been made in efforts to solve the above problem, and an object of the present disclosure is to provide a folding plate, which is manufactured with a thin thickness to contribute to reducing a thickness of a foldable phone, has a function of dissipating heat from a display and supporting the display, and has excellent support strength, and a manufacturing method thereof.

Solution to Problem

In order to achieve the object, according to features of the present disclosure, a folding plate may include a folding portion which is to be folded, and a first support portion and a second support portion which are placed on both sides based on the folding portion, wherein each of the folding portion, the first support portion, and the second support portion has a multilayer structure including a first metal sheet, a brazing filler layer formed on the first metal sheet, a second metal sheet braze-bonded on the first metal sheet by the brazing filler layer, and the first metal sheet and the second metal sheet are formed of different metal materials.

The first metal sheet may be a steel use stainless (SUS) metal sheet, and the second metal sheet may be a Cu metal sheet.

The brazing filler layer may be one among Ag, an AgCu metal sheet, and an AgCu metal sheet alloy.

The brazing filler layer may have a thickness of 1.0 μm or more and 10 μm or less.

The folding portion may be formed in the form of a mesh shape.

A method of manufacturing a heterojunction metal plate may include preparing a first metal sheet and a second metal sheet formed of a material different from that of the first metal sheet, forming a brazing filler layer on the first metal sheet, stacking the second metal sheet on the brazing filler layer and brazing the second metal sheet.

A method of manufacturing a folding plate may include preparing a first metal sheet and a second metal sheet formed of a material different from that of the first metal sheet, forming a brazing filler layer on the first metal sheet, stacking the second metal sheet on the brazing filler layer, brazing the second metal sheet, and manufacturing a heterojunction metal plate, photo-etching the heterojunction metal plate to form a folding portion to be folded in a central portion of the heterojunction metal plate, and forming a folding plate shape including a first support portion and a second support portion on both sides based on the folding portion.

In the preparing the first metal sheet and the second metal sheet formed of a material different from that of the first metal sheet, the first metal sheet may be prepared of a steel use stainless (SUS) metal sheet, and the second metal sheet may be prepared of a Cu metal sheet.

In the forming of the brazing filler layer on the first metal sheet, the brazing filler layer may be formed to have a thickness of 1.0 μm or more and 10 μm or less by sputtering.

The stacking of the second metal sheet on the brazing filler layer and the brazing of the second metal sheet may be performed at a temperature ranging from 780° C. to 950° C., and upper weighting or pressurizing may be performed during brazing.

In the forming of the folding plate shape, a plurality of cutting grooves may be further formed along an edge of the folding plate shape.

Advantageous Effects of Invention

In accordance with the present disclosure, since a plate in which a Cu metal sheet having high strength and a high heat dissipation function is braze-bonded to a steel use stainless (SUS) metal sheet having excellent bending repeatability is photo-etched to form a mesh-shaped folding portion and a first support portion and a second support portion, each having a plate shape, there is an effect of being able to manufacture a folding plate which is thin, lightweight, and strong, and easily dissipates heat.

In addition, in accordance with the present disclosure, since the brazing filler layer for braze-bonding is formed of one among Ag, AgCu, and AgCu alloy, movement of heat is facilitated so that the heat of the SUS metal sheet can quickly move to the Cu metal sheet and heat dissipation effect can be maximized.

Therefore, the present invention can be very usefully applied to a foldable phone requiring high heat dissipation, high strength, high flexibility, weight reduction, and miniaturization.

BRIEF DESCRIPTION OF DRAWINGS

FIG. 1 is a diagram illustrating an example of a foldable phone.

FIG. 2 is a plan view illustrating a folding plate according to an embodiment of the present disclosure.

FIG. 3 is a cross-sectional view illustrating the folding plate according to an embodiment of the present disclosure.

FIG. 4 is a cross-sectional view illustrating a folding plate according to another embodiment of the present disclosure.

FIG. 5 is a process diagram illustrating a method of manufacturing a folding plate according to an embodiment of the present disclosure.

DESCRIPTION OF EMBODIMENTS

Hereinafter, embodiments of the present disclosure will be described in detail with reference to the accompanying drawings.

A folding plate according to an embodiment of the present disclosure may be applied to a foldable phone, which is a folding type mobile terminal in which a display is folded. The folding plate may be attached to a rear surface of the display of the foldable phone to perform a function of dissipating heat of the display and supporting the display.

FIG. 1 is an example of the foldable phone and shows an in-folding type foldable phone P in which a left side and a right side of a display 11 are folded inward about a vertical axis. The foldable phone P includes an auxiliary display 13 shown in a folded state, and an organic light emitting diode (OLED) display may be applied to the display.

A folding plate 100 (see FIG. 2) is disposed on a rear surface of the display 11, and thus, when the foldable phone P is folded, a folding portion is completely folded, and when the foldable phone P is unfolded, a screen of the display is supported so as not to be wrinkled so that foldable phone P allow flatness to be maintained during use.

An example of a shape which is applied to the in-folding type foldable phone shown in FIG. 1 will be described as the folding plate according to an embodiment of the present disclosure. For reference, in the accompanying drawings of the present disclosure, there are exaggerated portions for describing each component.

FIG. 2 is a plan view illustrating a folding plate according to an embodiment of the present disclosure.

As shown in FIG. 2, the folding plate 100 includes a folding portion 110, a first support portion 120, and a second support portion 130.

The folding plate 100 includes the folding portion 110 which has elasticity and is to be folded. The first support portion 120 and the second support portion 130 are disposed on both sides of the folding plate 100 based on the folding portion 110. That is, in the folding plate 100, the first support portion 120 and the second support portion 130 are placed on both sides of the folding portion 110.

The folding portion 110 is formed in the form of a mesh shape. The first support portion 120 and the second support portion 130 are each formed in the form of a plate shape. The mesh-shaped folding portion 110 is to improve bendability of the folding plate 100, and the plate-shaped first support portion 120 and the plate-shaped second support portion 130 are to improve a restoring force of the folding plate 100.

FIG. 3 is a cross-sectional view illustrating the folding plate according to an embodiment of the present disclosure.

As shown in FIG. 3, the folding portion 110, the first support portion 120, and the second support portion 130 are formed in a plate made of a multilayer structure. The plate made of a multilayer structure is a heterojunction metal plate 1. Specifically, the folding portion 110, the first support portion 120, and the second support portion 130 are formed by photo-etching the heterojunction metal plate 1.

The heterojunction metal plate 1 (see FIG. 5) includes a first metal sheet 10, a brazing filler layer 20, and a second metal sheet 30. The heterojunction metal plate 1 has a multilayer structure in which the first metal sheet 10, the brazing filler layer 20, and the second metal sheet 30 are stacked.

The brazing filler layer 20 is formed on the first metal sheet 10, and the second metal sheet 30 is braze-bonded by the brazing filler layer 20 on the first metal sheet 10.

The first metal sheet 10 and the second metal sheet 30 are formed of different metal materials.

The first metal sheet 10 is a steel use stainless (SUS) metal sheet, and the second metal sheet 30 is a Cu metal sheet. The SUS metal sheet is to secure a strength and improve bending repeatability, and the Cu metal sheet is to secure thermal conductivity. SUS has an excellent bending repeatability and an excellent strength. Cu has an excellent heat dissipation effect. The second metal sheet 30 may quickly dissipate heat generated from the display.

For example, the first metal sheet 10 may employ SUS 304 or SUS 316. SUS 304 or SUS 316 has an excellent strength with a tensile strength of 550 MPa or more. The second metal sheet 30 may employ a C7025 or C7035 EH class. The C7025 or C7035 EH class has a tensile strength of 900 MPa or more and thermal conductivity of 100 W/m.K or more and thus has an excellent strength and high thermal conductivity. SUS 304 or SUS 316 having a thickness ranging from 0.1 mm (100 μm) to 0.15 mm (150 μm) may be used.

The brazing filler layer 20 may be one among Ag, AgCu, and a AgCu alloy. Each of Ag, AgCu, and the AgCu alloy has high thermal conductivity and transfers heat transferred to the SUS metal sheet to the Cu metal sheet, thereby facilitating heat dissipation. In addition, each of Ag, AgCu, and the AgCu alloy increases an adhesive force between the SUS metal sheet and the Cu metal sheet which are dissimilar metals.

Although the first metal sheet 10 and the second metal sheet 30 may be adhered with an adhesive tape instead of the brazing filler layer 20, and when compared to the brazing filler layer 20, the adhesive tape has a relatively thick thickness and poor thermal conductivity, thereby greatly reducing heat dissipation efficiency.

The brazing filler layer 20 has a thickness of 1.0 μm or more and 10 μm or less. The brazing filler layer 20 is formed to have a thickness of 1.0 μm or more and 10 μm or less so that a thickness of the heterojunction metal plate 1 may be controlled to be thin. The brazing filler layer 20 may be formed as a thin film of a multilayer structure. For example, the brazing filler layer 20 may be a thin film of a multilayer structure including an Ag layer and a Cu layer formed on the Ag layer or may be a thin film of a multilayer structure including an Ag layer, a Cu layer formed on the Ag layer, and an Ag layer formed on the Cu layer. Alternatively, the brazing filler layer 20 may include, for example, 65 to 75 wt % of Ag and 35 to 25 wt % of Cu. The multilayer structure of the brazing filler layer 20 may have blurred boundaries after braze-bonding the first metal sheet 10 to the second metal sheet 30.

In the heterojunction metal plate 1 of the present embodiment, the brazing filler layer 20 is formed on one surface of the first metal sheet 10, and the second metal sheet 30 is braze-bonded on one surface of the first metal sheet 10 by the brazing filler layer 20. The first metal sheet 10 is a SUS metal sheet.

Heterojunction metal plate 1 has high rigidity due to integration by braze-bonding the Cu metal sheet and the SUS metal sheet. Since a rigid material is difficult to fold, the folding portion 110 is formed in a mesh shape to serve as a spring. In addition, in order to allow the folding portion 110 to be flat unfolded without folded boundary marks when unfolded, the plate-shaped first support portion 120 and the plate-shaped second support portion 130 are formed on both sides of the folding portion 110. The folding plate 100 is fully folded by the folding portion 110, and when unfolded, the folding plate 100 may become a flat plane without folded boundary marks by the first support portion 120 and the second support portion 130.

More specifically, the mesh-shaped folding portion 110 is formed in a length direction in a central portion of the heterojunction metal plate 1 in which the Cu metal sheet and the SUS metal sheet are braze-bonded and integrated, and the first support portion 120 and the second support portion 130 are formed on both sides of the folding portion 110.

The folding portion 110 has a predetermined width and thus may be bent and folded in a width direction. The folding portion 110 serves as a support and a spring. The folding portion 110 is formed such that the central portion of the heterojunction metal plate 1 is photo-etched to form a mesh pattern in the length direction. When a mesh is formed by punching the heterojunction metal plate 1 using a press, a mesh pattern is not precise. When the mesh pattern is not precise, it is difficult to form the folding portion 110 having a desired elastic force.

The mesh pattern of the folding portion 110 is formed in the form in which lines intersect each other. Since the folding portion 110 should have durability to be folded and unfolded tens of thousands of times, a mesh pattern in which the lines intersect each other is employed to improve the durability.

The SUS metal sheet and the Cu metal sheet constituting the heterojunction metal plate 1 have good photo-etching properties so that a desired-shaped mesh pattern may be formed. The mesh pattern may have a line width ranging from 80 μm to 120 μm and an interval between lines ranging from 100 μm to 300 μm. For example, the mesh pattern may have a line width of 100 μm and an interval between lines of 200 μm. The mesh pattern of the folding portion 110 preferably has a line width L of 100 μm to allow elasticity to be free.

The heterojunction metal plate 1 is formed such that the Cu metal sheet and the SUS metal sheet are braze-bonded and integrated, thereby having excellent heat dissipation. The folding plate 100 manufactured by photo-etching the heterojunction metal plate 1 may support the display and quickly dissipate heat generated from the display.

In the above-described embodiment, the folding plate 100 is formed by photo-etching the heterojunction metal plate 1 in which the Cu metal sheet 30 is braze-bonded and integrated with one surface of the SUS metal sheet 10.

In another embodiment, as shown in FIG. 4, a heterojunction metal plate in which Cu metal sheets 30 and 50 are braze-bonded and integrated with both sides of a SUS metal sheet 10 is photo-etched so that a folding plate 100a may be formed.

Specifically, the folding plate 100a of another embodiment is formed such that brazing filler layers 20 and 40 are formed on both sides of the first metal sheet 10, and thus the folding portion 110a and first and second support portions 120a and 130a, each of which has a stacked structure in which the second metal sheet 30 and the third metal sheet 50 are braze-bonded on both surfaces of the first metal sheet 10 by the brazing filler layers 20 and 40, are provided. The first metal sheet 10 is a SUS metal sheet, and each of the second metal sheet 30 and the third metal sheet 50 is a Cu metal sheet. Although another embodiment has a disadvantage of having a thickness that is thicker than that of one embodiment, since the Cu metal sheets 30 and 50 are bonded to both sides of the SUS metal sheet 10, the folding plate 100a has high strength and high heat dissipation efficiency.

Although not shown in the drawing, the heterojunction metal plate constituting the folding plate 100a may be formed by bonding multiple layers of dissimilar metals. The brazing filler layers 20 and 40 are applicable to the bonding of multiple layers of dissimilar metals.

FIG. 5 is a process diagram illustrating a method of manufacturing a folding plate according to an embodiment of the present disclosure.

As shown in FIG. 5, a method of manufacturing a folding plate includes manufacturing the heterojunction metal plate 1, forming a folding plate shape 1a in which the folding portion 110 is formed to be folded in a central portion of the heterojunction metal plate 1 by photo-etching the heterojunction metal plate 1, and the first support portion 120 and the second support portion 130 are formed on both sides of the heterojunction metal plate 1 based on the folding portion 110, and separating the folding plate shape from the heterojunction metal plate 1.

The manufacturing of the heterojunction metal plate includes preparing the first metal sheet 10 and the second metal sheet 30 formed of a material different from that of the first metal sheet 10, forming the brazing filler layer 20 on the first metal sheet 10, and stacking the second metal sheet 30 on the brazing filler layer 20 and brazing the second metal sheet 30.

The preparing of the first metal sheet 10 and the second metal sheet 30 formed of a material different from that of the first metal sheet 10 (30) includes preparing a SUS metal sheet as the first metal sheet 10, and preparing a Cu metal sheet as the second metal sheet 30.

In the forming of the brazing filler layer 20 on the first metal sheet 10, the brazing filler layer 20 having a thickness of 1.0 μm or more and 10 μm or less is formed on the first metal sheet 10 by sputtering.

In addition to sputtering, the brazing filler layer 20 may be disposed on one side or both sides of the first metal sheet 10 in the form of a Bag 8 foil, a plating filler metal, or a paste. However, when the brazing filler layer 20 is formed on one side or both sides of the first metal sheet 10 by sputtering, the brazing filler layer 20 may be formed with the thinnest thickness.

For example, the brazing filler layer 20 in the form of a thin film is formed on one surface of a SUS 304 metal sheet or a SUS 316 metal sheet by sputtering. A material of the thin film brazing filler layer is made of one of Ag, AgCu, and an AgCu alloy, and a thickness thereof is formed to be 1.0 μm or more and 10 μm or less.

The stacking of the second metal sheet 30 on the brazing filler layer 20 and the brazing of the second metal sheet 30 is performed at a temperature ranging from 780° C. to 950° C., and upper weighting or pressurizing is performed during brazing.

For example, in the brazing, a stacked structure in which the second metal sheet 30 is stacked on the brazing filler layer 20 formed on one surface or both surfaces of the first metal sheet 10 is prepared and disposed between an upper pressurizing jig and a lower pressurizing jig in a brazing furnace, and both surfaces of the stacked structure is pressurized during heating. Alternatively, a stacked structure in which the second metal sheet 30 is stacked on the brazing filler layer 20 formed on one surface or both surfaces of the first metal sheet 10 is prepared and disposed in the brazing furnace, and a weight is placed on an upper surface of the stacked structure to pressurize the stacked structure from the top. The upper weighting and pressurizing performed during brazing are for void-free bonding.

In addition, in the brazing, in the brazing furnace at a reducing atmosphere or a vacuum, according to the component and composition of the brazing filler layer 20, a heating temperature in the brazing furnace is controlled to a temperature of 780° C. or more, and preferably in the range of 780° C. to 950° C. so that an efficient brazing process is performed.

The forming of the folding plate shape includes photo-etching the manufactured heterojunction metal plate 1 to form the mesh-shaped folding portion 110 of which central portion is folded, and forming the first support portion 120 and the second support portion 130 on both sides based on the folding portion 110.

The forming of the folding plate shape further includes forming cutting grooves 140 and 150 along an edge of the folding plate shape 1a.

The mesh-shaped folding portion 110 is formed by etching through the central portion of the heterojunction metal plate 1, and the cutting grooves 140 and 150 are formed as a plurality of grooves along the edge so as to facilitate separation of the folding plate shape 1a. The plurality of grooves are connected by a bridge. The separating of the folding plate shape from the heterojunction metal plate 1 may be performed by cutting the bridge connecting the cutting grooves 140 and 150 and separating the folding plate shape.

Hereinafter, an operation of the present disclosure will be described.

In the embodiment of the present disclosure, the thin-film brazing filler layer 20 is formed on one surface of the SUS metal sheet 10 by sputtering, the Cu metal sheet 30 is stacked on the thin-film brazing filler layer 20 and then the heterojunction metal plate 1 in which the SUS metal sheet 10 and the Cu metal sheet 30 were bonded by brazing is manufactured, and the heterojunction metal plate 1 is photo-etched so that it is possible to manufacture the folding plate 100 which meets the requirements for high strength and high heat dissipation.

In addition, in another embodiment of the present disclosure, the thin-film brazing filler layer 20 is formed on both surfaces of the SUS metal sheet 10 by sputtering, the Cu metal sheets 30 and 50 are stacked on the double-sided thin filmbrazing filler layer 20 and then the heterojunction metal plate in which the SUS metal sheet 10 and the Cu metal sheets 30 and 50 are bonded by brazing is manufactured, and the heterojunction metal plate 1 is photo-etched so that it is possible to manufacture the folding plate 100a which meets the requirements for high strength and high heat dissipation.

The above-described folding plates 100 and 100a are made as the heterojunction metal plate 1 in which the Cu metal sheet 30 having excellent heat dissipation performance is bonded to the SUS metal sheet 10 having excellent bending repeatability so that the heterojunction metal plate 1 is strong and has an excellent heat dissipation effect.

In addition, since each of the above-described folding plates 100 and 100a has a structure in which the Cu metal sheet having high strength and a high heat dissipation function is braze-bonded and integrated with the SUS metal sheet having excellent bending repeatability, the heterojunction metal plate 1 is thin, lightweight, and strong, and heat dissipation efficiency thereof is maximized Each of the above-described folding plates 100 and 100a is applied to a foldable phone and may be used as a folding plate to support the display.

The above-described folding plate 100 or 100a has a plate structure in which the Cu metal sheet 30 is bonded to one surface or both surfaces of the SUS metal sheet 10 and has excellent strength and easy heat dissipation, thereby satisfying the requirements of high strength and high heat dissipation, and since the brazing filler layer 20 is thin, it is possible to manufacture the folding plates 100 and 100a, each having a thin thickness, and contribute to weight reduction and miniaturization of a foldable phone.

In the present disclosure, exemplary embodiments are disclosed in the drawings and in the specification. Here, although specific terms have been used, they are only used for the purpose of describing the present disclosure and are not used to limit the meaning or scope of the present disclosure in the appended claims. Therefore, those skilled in the art will appreciate that various modifications and equivalent other embodiments can be derived from the scope of the present disclosure. Therefore, the true technical scope of the present disclosure should be defined by the technical spirit of the appended claims.

The invention claimed is:

1. A method of manufacturing a folding plate, comprising:
preparing a first metal sheet that is a SUS metal sheet and a second metal sheet that is a Cu metal sheet;
forming a brazing filler layer on the first metal sheet;
stacking the second metal sheet on the brazing filler layer, brazing the second metal sheet, and manufacturing a heterojunction metal plate;
photo-etching the heterojunction metal plate to form a folding portion to be folded in a central portion of the heterojunction metal plate; and
forming a folding plate shape including a folding portion, a first support portion and a second support portion, wherein the folding portion is formed in a mesh shape by photo-etching the heterojunction metal plate through the central portion of the first metal sheet, the brazing filler layer, and the second metal sheet, and wherein the first support portion and the second support portion are on both sides based on the folding portion.

2. The method of claim 1, wherein, in the forming of the brazing filler layer on the first metal sheet, the brazing filler layer is formed to have a thickness of 1.0 μm or more and 10 μm or less by sputtering.

3. The method of claim 1, wherein the stacking of the second metal sheet on the brazing filler layer and the brazing of the second metal sheet is performed at a temperature ranging from 780° C. to 950° C., and upper weighting or pressurizing is performed during brazing.

4. The method of claim 1, wherein, in the forming of the folding plate shape, a plurality of cutting grooves are further formed along an edge of the folding plate shape.

* * * * *